United States Patent
He et al.

(10) Patent No.: US 12,125,955 B2
(45) Date of Patent: Oct. 22, 2024

(54) DEEP ULTRAVIOLET LED INORGANIC MODULE PACKAGING DEVICE INCLUDING DOUBLE-SIDED MICROLENS ARRAY

(71) Applicants: GUANGDONG UNIVERSITY OF TECHNOLOGY, Guangzhou (CN); Shenzhen Shuangma Xingguang Electronic Technology Co., Ltd.

(72) Inventors: Miao He, Guangzhou (CN); Jiongjian Gao, Guangzhou (CN); Kunhua Wen, Guangzhou (CN); Zuyong Feng, Guangzhou (CN); Li Chen, Guangzhou (CN); Deping Xiong, Guangzhou (CN); Xuelan Feng, Shenzhen (CN)

(73) Assignees: GUANGDONG UNIVERSITY OF TECHNOLOGY, Guangzhou (CN); Shenzhen Shuangma Xingguang Electronic Technology Co., Ltd., Shenzhen (CN)

( * ) Notice: Subject to any disclaimer, the term of this patent is extended or adjusted under 35 U.S.C. 154(b) by 431 days.

(21) Appl. No.: 17/520,845

(22) Filed: Nov. 8, 2021

(65) Prior Publication Data
US 2023/0069990 A1  Mar. 9, 2023

(30) Foreign Application Priority Data
Aug. 26, 2021  (CN) .......................... 202110991333.5

(51) Int. Cl.
*H01L 33/58* (2010.01)
*G02B 1/00* (2006.01)
*G02B 3/00* (2006.01)

(52) U.S. Cl.
CPC ................ *H01L 33/58* (2013.01); *G02B 1/00* (2013.01); *G02B 3/0056* (2013.01)

(58) Field of Classification Search
CPC ........ G02B 19/0095; G02B 1/00; H01L 33/62
See application file for complete search history.

(56) References Cited

U.S. PATENT DOCUMENTS

| | | | |
|---|---|---|---|
| 6,587,274 | B1 | 7/2003 | Border et al. |
| 2003/0127759 | A1 | 7/2003 | Border et al. |

(Continued)

FOREIGN PATENT DOCUMENTS

| | | |
|---|---|---|
| CN | 111162070 A | 5/2020 |
| CN | 112630873 A | 4/2021 |

*Primary Examiner* — Jay C Chang
*Assistant Examiner* — Mikka Liu

(57) ABSTRACT

A method for preparing a double-sided microlens array, which is used to prepare a uniform, large-area and easy-to-control microlens array on upper and lower surfaces of a sapphire glass lens. A complete laser wavefront is spatially divided into many tiny parts, and each part is focused on the focal plane by a corresponding small lens, and the light spots are overlapped to achieve uniform light in a specific area. The sapphire glass lens is applied to the deep ultraviolet LED inorganic module packaging device to reduce the total reflection loss between the deep ultraviolet LED package optical window-air interface, and focus the light passing through the lens on the focal plane, while increasing the emission of light Coupling ability, uniform light intensity of ultraviolet LED.

6 Claims, 7 Drawing Sheets

(56) References Cited

U.S. PATENT DOCUMENTS

| | | | | |
|---|---|---|---|---|
| 2006/0284208 A1* | 12/2006 | Kang | ............... | H01L 24/82 |
| | | | | 257/100 |
| 2009/0315061 A1* | 12/2009 | Andrews | ............. | H01L 33/48 |
| | | | | 438/26 |
| 2015/0102375 A1* | 4/2015 | Kim | ............... | H01L 33/56 |
| | | | | 257/98 |
| 2017/0338382 A1* | 11/2017 | Park | ............... | H01L 33/58 |
| 2021/0155030 A1* | 5/2021 | Kurani | ............... | G06F 3/016 |

* cited by examiner

DEEP ULTRAVIOLET LED INORGANIC MODULE PACKAGING DEVICE INCLUDING DOUBLE-SIDED MICROLENS ARRAY

CROSS-REFERENCE TO RELATED APPLICATIONS

The present application claims foreign priority of Chinese Patent Application No. 202110991333.5, filed on Aug. 26, 2021 in the China National Intellectual Property Administration, the disclosures of all of which are hereby incorporated by reference.

TECHNICAL FIELD

This disclosure relates to the field of ultraviolet LED preparation, in particular to a method for preparing a double-sided microlens array and a deep ultraviolet LED inorganic module packaging device.

BACKGROUND

With the development of technology, the performance of ultraviolet LEDs has been continuously improved. Compared with the gas ultraviolet light sources commonly used at present, the ultraviolet LEDs are cold light sources with advantages such as long life, high reliability, uniform illumination, high efficiency, and no toxic substances. The ultraviolet LEDs play an important role in the fields of biomedicine, surface sterilization and cleaning, printing lithography, light curing production, and communication detection.

However, the development of deep ultraviolet LEDs is currently facing many challenges. The traditional LED packaging structure makes the light emitting of the ultraviolet LED chip uneven, which cannot meet the usage requirement of high-performance and high-uniformity of the ultraviolet LEDs. Therefore, how to improve the light extraction efficiency and light emitting uniformity of ultraviolet LED packaging devices is the focus of research in the field of ultraviolet LED packaging.

The publication number CN106935695A discloses an ultraviolet LED device. Wherein a LED chip is arranged at a bottom of a support. In the solution, an ultraviolet LED chip is welded in the ultraviolet LED device in an eutectic flip-chip manner. Then a quartz glass cover plate is sealed to keep an enclosed ring space. However, the light extraction efficiency and light emitting uniformity of the quartz glass cover plate do not achieve the best effect and need to be improved.

SUMMARY

The disclosure provides a method for preparing a double-sided microlens array and a deep ultraviolet LED packaging structure using the double-sided microlens array for the light extraction rate and light output uniformity of an ultraviolet LED packaging device, and a sapphire glass lens having a double-sided microlens array structure is used to improve the light emitting uniformity of the ultraviolet LED chip, so that a better light-emitting performance is achieved.

In order to solve the above technical problems, the technical solution adopted by the present disclosure is as follows.

A method for preparing a double-sided microlens array, wherein a sapphire glass lens is adopted and the method includes:
 S1, polishing one side of the sapphire glass lens, and depositing a 200 nm thick $SiO_2$ film on the polished surface by plasma chemical vapor deposition at a processing temperature of 300° C.;
 S2, spin-coating 700 nm thick positive photoresist, and performing a projection exposure by a mask, and then performing a projection exposure by a stepper lithography machine with an exposure wavelength of 365 nm, and an exposure time of 290 ms;
 S3, developing at a positive photoresist position for 50 seconds to form nanopores, and then transferring a pattern onto the $SiO_2$ film by plasma etching for 1 minute;
 S4, etching the sapphire glass lens by a strong acid mixture heated to 270° C. for 6 minutes, and then removing the $SiO_2$ film by oxygen plasma etching;
 S5, repeating steps S1-S4 on the other side of the sapphire glass lens to complete a double-sided preparation;
 S6, cutting the sapphire glass lens with a nano-array into cube units by a laser, packaging the cube units on a deep ultraviolet LED by using a fluoropolymer sealant to form an enclosed structure.

By using micro-nano array double-sided lens, a better light uniformity of the deep ultraviolet LED is achieved. Based on the refraction principle of geometric optics, light at the interface of two transparent media (such as air and glass) will bend toward the area with high refractive index. The higher the refractive index of the material, the stronger the ability of incident light to refract. Through this principle, a complete laser wavefront is spatially divided into many tiny parts, and each part is focused on the focal plane by a corresponding small lens, and the light spots are overlapped to achieve uniform light in a specific area.

Specifically, in step S3, the plasma etching is performed in a mixed atmosphere of $CF_4$ and $O_2$.

Specifically, the strong acid mixture is a solution mixture of 98% concentrated sulfuric acid and 84% concentrated phosphoric acid, and a volume ratio of the two acids is 3:1.

A deep ultraviolet LED inorganic module packaging device, including a ceramic base, an ultraviolet LED chip, and the sapphire glass lens of claim 3, the ceramic base is provided with a groove, and the ultraviolet LED chip is welded in the groove by a gold-tin eutectic flip-chip manner, and there are at least two metal layers between positive and negative electrodes of the ultraviolet LED chip and a bottom surface of the groove. The ceramic base is an AlN ceramic base, and there are at least two metal layers with good thermal and electrical conductivity between the positive and negative electrodes of the ultraviolet LED chip and a bottom surface of the groove to realize the eutectic flip-chip welding of the ultraviolet LED chip.

The usual quartz flat glass is replaced with the sapphire glass lens, and a uniform, large-area and easy-to-control nano-array is prepared by using the upper and lower surfaces of the sapphire glass lens, which can reduce the total reflection loss between the optical window and air interface of the deep ultraviolet LED package and increase the coupling ability of the emitted light and enhance the light uniformity of the deep ultraviolet LED.

In addition, an edge of the groove is provided with a stepped structure, and the sapphire glass lens is mounted on the stepped structure and completely covers the groove. The sapphire glass lens is bonded with the stepped structure of the groove.

Further, an enclosed space formed by the groove and the sapphire glass lens is filled with a protective gas.

Further, a cube unit of the sapphire glass lens has a lens curvature radius of 27 nm on a side facing the ultraviolet LED chip, and a lens curvature radius of 22 nm on an opposite side. Because the curvature radius is too large, the refractive index gradient of the microlens array layer is not obvious, thereby reducing the illuminance and light intensity. If the curvature radius is too small, the thickness of the microlens array will increase, which is not conducive to light transmission, thereby reducing the illuminance and light intensity.

Further, a dominant wavelength of light of the ultraviolet LED chip is 260 nm.

Further, a lens thickness of the cube unit is 12 nm.

Further, a dimension of the ultraviolet LED chip is 1 mm×1 mm, and a bottom is provided with symmetrical electrodes. The symmetrical electrode is welded to the metal layer.

Further, the ceramic base is an aluminum nitride ceramic base.

Compared with the prior art, the present disclosure has following beneficial effects. The present disclosure discloses a method for preparing a double-sided microlens array, by which the selected sapphire glass lens is processed to form nano-arrays on the upper and lower surfaces of the sapphire glass lens to improve light refractive index.

In the deep-ultraviolet LED inorganic module package structure of the double-sided microlens array, quartz flat glass is replaced with the sapphire glass lens, and a uniform, large-area and easy-to-control nano-array is prepared by using the upper and lower surfaces of the sapphire glass lens, which can reduce the total reflection loss between the optical window-air interface of the deep ultraviolet LED package, focus the light passing through the lens on the focal plane, increase the coupling ability of the emitted light, and uniform the light intensity of the ultraviolet LED. The microlens array deep ultraviolet ultraviolet LED inorganic module packaging structure also has the advantages of high luminous intensity, anti-static discharge damage, high efficiency and reliability.

Figure 1:
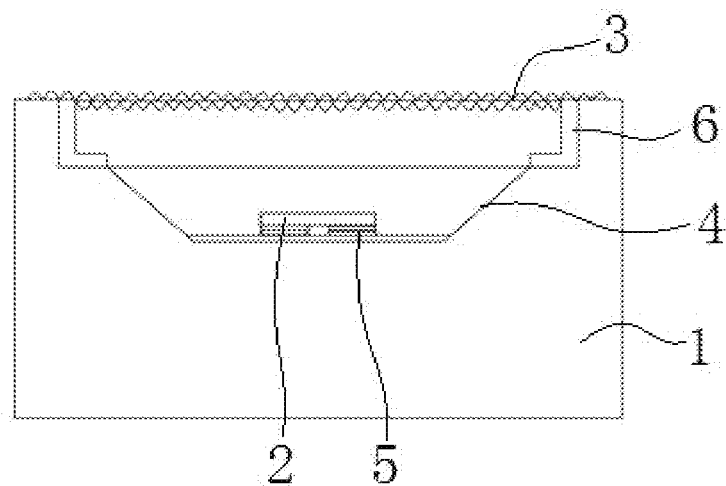
FIG. 1 is a structural schematic diagram of a deep ultraviolet LED inorganic module packaging device according to an embodiment.

Wherein, 1, ceramic base; 2, ultraviolet LED chips; 3, sapphire glass lens; 4, groove; 5, metal layers; 6, stepped structure.

DETAILED DESCRIPTION OF PREFERRED EMBODIMENTS

The drawings are only for illustrative purposes and do not be understood as a limitation of the present application; in order to better illustrate the embodiment, some parts of the drawings may be omitted, enlarged or reduced, and do not represent the size of the actual product; it is understandable for the skilled person in the art that some well-known structures in the drawings and their descriptions may be omitted. The positional relationship described in the drawings is only for illustrative purposes and do not be understood as a limitation of the present application.

Embodiment

Figure 2:
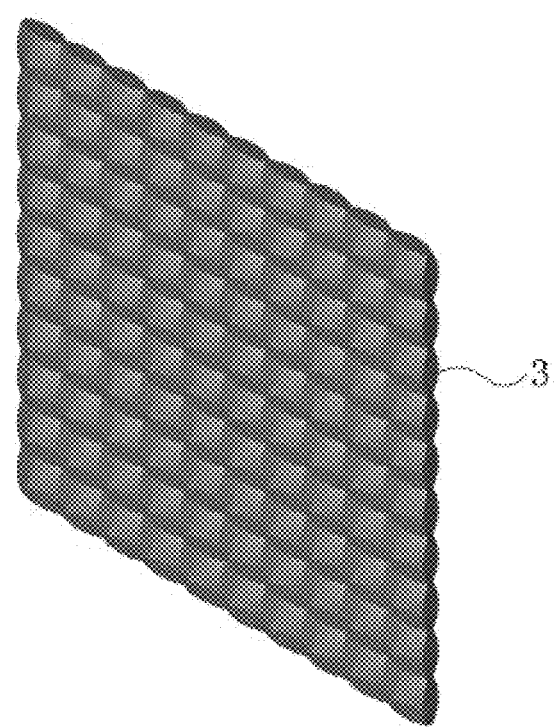
FIG. 2 is a structural schematic diagram of a sapphire glass lens.
Figure 3:
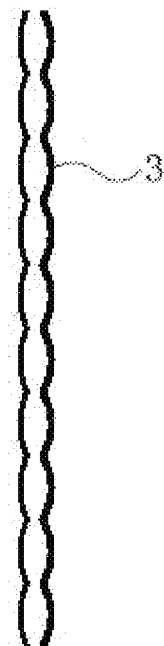
FIG. 3 is a side view of the sapphire glass lens.
Figure 4:
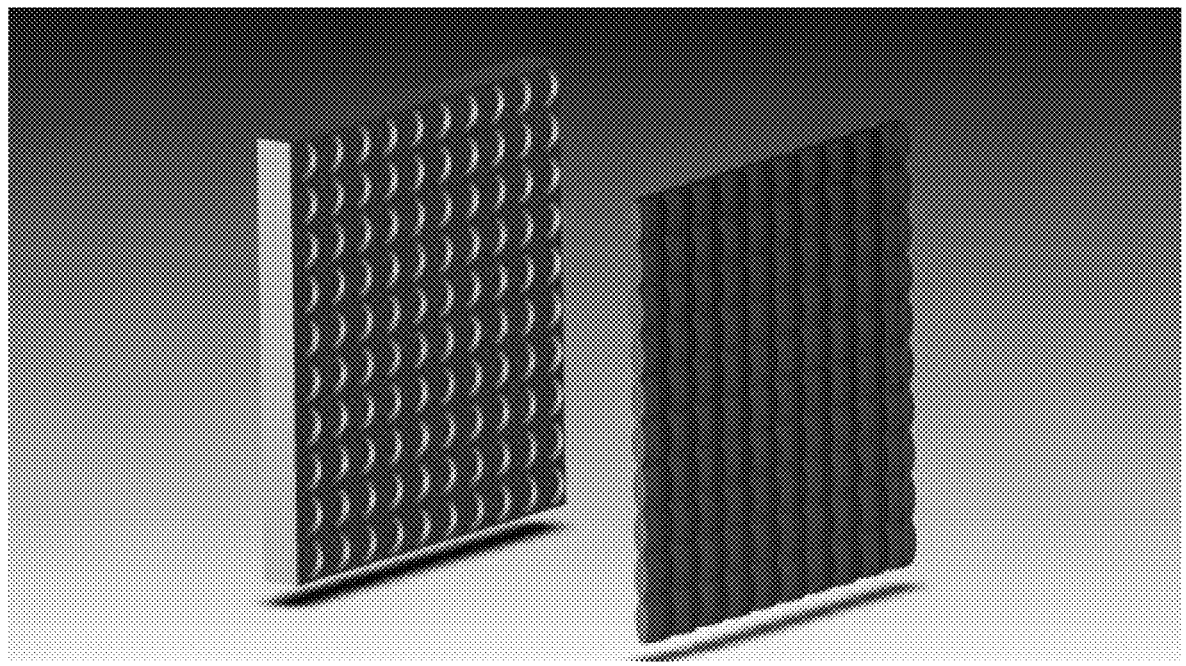
FIG. 4 is a simulation diagram of a package structure of an experimental case.
Figure 5:
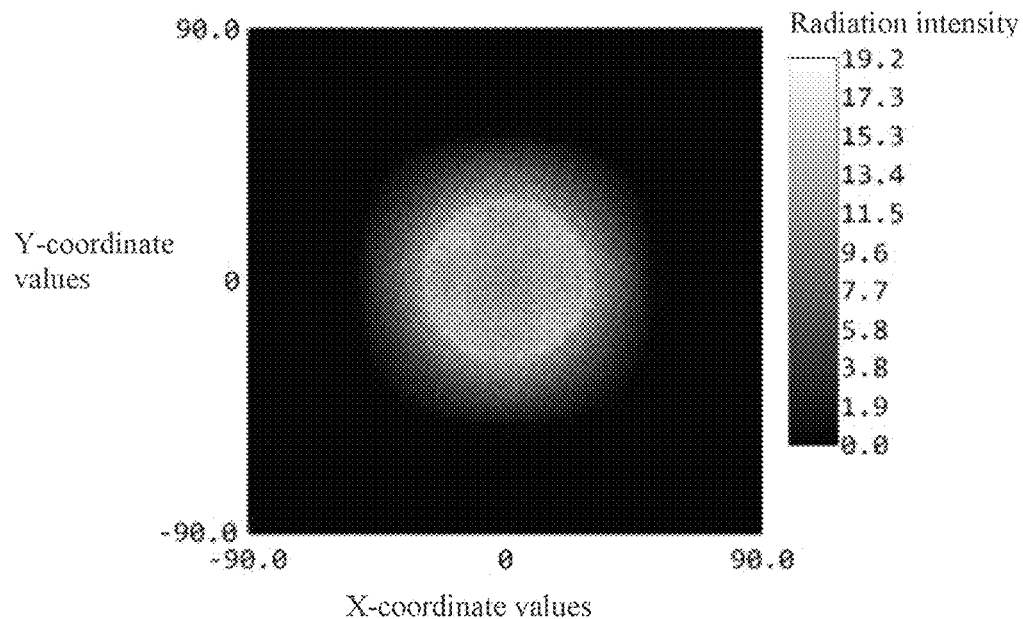
FIG. 5 is a graph of peak light intensity data of a simulation experiment of the experimental case.
Figure 6:
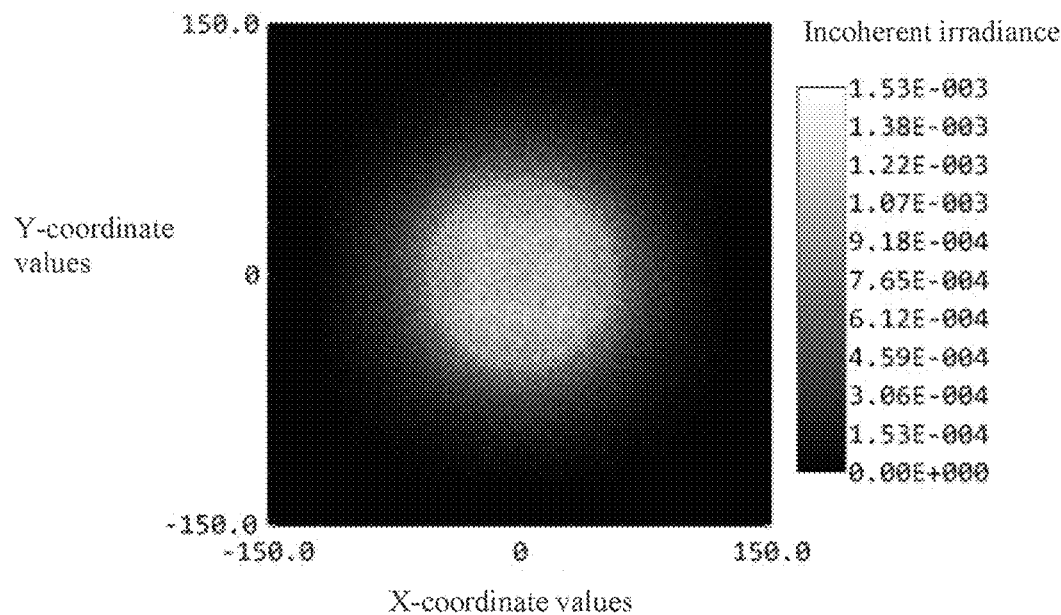
FIG. 6 is a graph of peak illuminance data of the simulation experiment of the experimental case.
Figure 7:
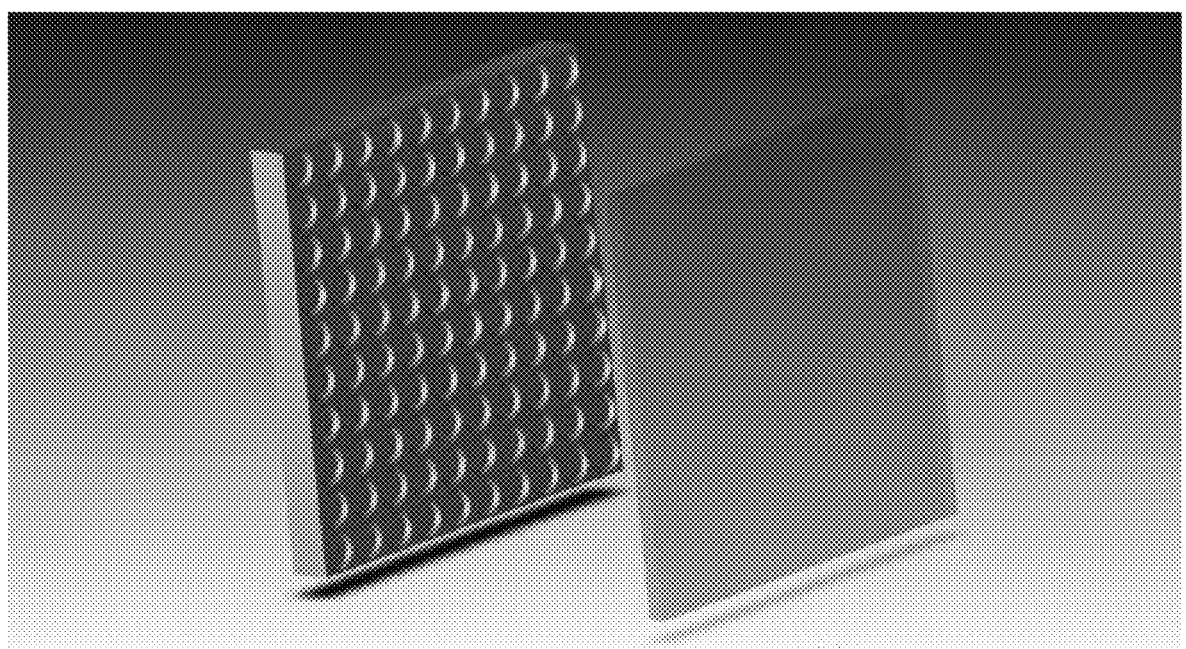
FIG. 7 is a simulation diagram of a package structure of an comparative case.
Figure 8:
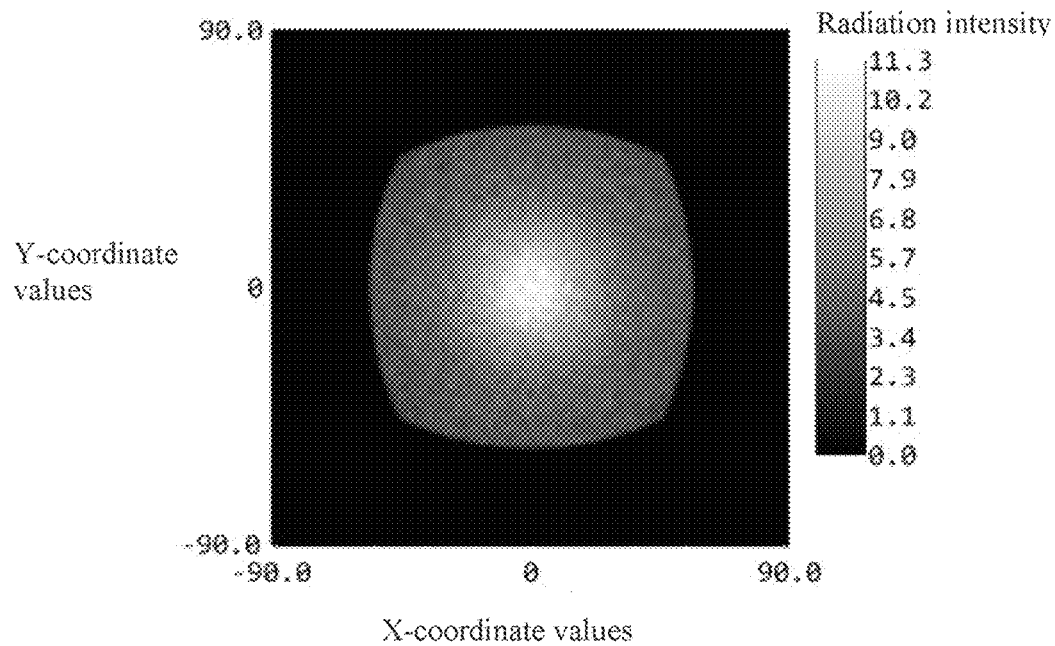
FIG. 8 is a graph of peak light intensity data of a simulation experiment of the comparative case.
Figure 9:
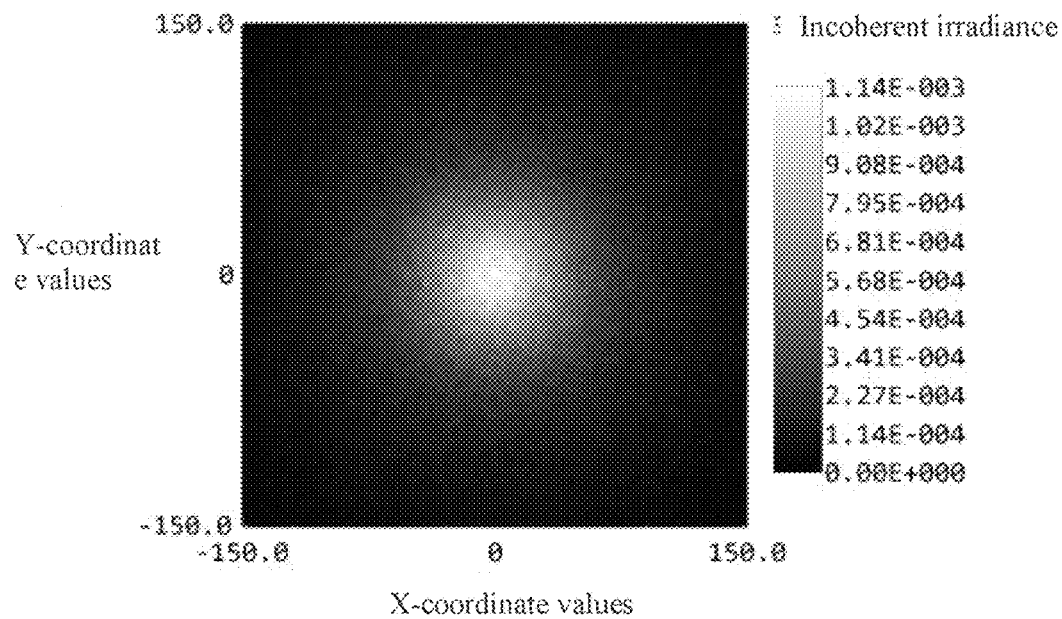
FIG. 9 is a graph of peak illuminance data of a simulation experiment of comparative case.

As shown in FIGS. 1-3, the embodiment provides a method for preparing a double-sided microlens array. A sapphire glass lens 3 of a suitable size is selected and the method includes following steps:

First, the sapphire glass lens 3 is polished on one side, and a 200 nm thick $SiO_2$ film is deposited on the polished surface by plasma chemical vapor deposition at a processing temperature of 300° C.; then, a 700 nm thick PR (positive photoresist) is spin-coated, and a projection exposure is performed by using a mask, and then a projection exposure is performed by using a stepper lithography machine with an exposure wavelength of 365 nm, and an exposure time of 290 ms; then the PR is developed for 50 seconds to form nanopores, and then a pattern is transferred onto the $SiO_2$ film by plasma etching for 1 minute; wherein the plasma etching is carried out in a mixed atmosphere of $CF_4$ and $O_2$; finally, the sapphire glass lens is etched by a solution mixture of 98% concentrated sulfuric acid and 84% concentrated phosphoric acid heated to 270° C. The volume ratio of the two strong acids is 3:1. The etching time is 6 minutes. And then the $SiO_2$ film is removed by oxygen plasma etching.

In the same way, the above operation is repeated on the other side of the sapphire glass lens 3 to complete the double-sided processing of the sapphire glass lens 3. After the processing is completed, the sapphire glass lens 3 with the nano-array is cut into a plurality of cube units using a laser, and the plurality of cube units are packaged on the deep ultraviolet LED by using a fluoropolymer sealant to form an enclosed structure.

At the same time, the embodiment also provides a deep ultraviolet LED inorganic module packaging device, which includes a ceramic base 1, an ultraviolet LED chip 2 and a sapphire glass lens 3 with a nano-array on both sides, wherein the ceramic base 1 is aluminum nitride (AlN) ceramic base 1, the ceramic base 1 is provided with a groove 4, the groove 4 includes an annular slope at a preset angle to a horizontal plane, a dimension of the ultraviolet LED chip 2 is 1 mm×1 mm, and a bottom is provided with symmetrical electrodes. The ultraviolet LED chip 2 is located in a center of the bottom of the groove 4, and side walls of the groove 4 are tapered and expanded outward to avoid blocking the light path propagation of the ultraviolet LED chip 2. The dominant wavelength of light of the ultraviolet LED chip 2 is 260 nm.

In the embodiment, the ultraviolet LED chip 2 is welded in the groove 4 through Au—Sn eutectic flip-chip manner. Generally, there are three metal layers 5 between the positive and negative electrodes of the ultraviolet LED chip 2 and the bottom surface of the groove 4. The three metal layers 5 include a first metal layer 5 plated on the positive and negative electrodes of the ultraviolet LED chip 2, a second metal layer 5 plated on the bottom surface of the groove 4, and the third metal layer 5 located between the first metal layer 5 and the second metal layer 5; the first metal layer 5 and the second metal layer 5 are both gold film layers, the third metal layer 5 is a tin film layer; and the thickness of the first metal layer 5 is 7-10 um; the thickness of the second metal layer 5 is 3-5 um, and the thickness of the third metal layer 5 is 4-5 um.

In addition, an edge of the groove 4 is provided with a stepped structure 6, the sapphire glass lens 3 is mounted on the stepped structure 6 and completely covers the groove 4, and an enclosed space formed between the sapphire glass lens 3 and the groove 4 is filled with protection gas, the protective gas can be inert gas or nitrogen. Specifically, the stepped structure 6 and the sapphire glass lens 3 with a nano-array are bonded with a fluoropolymer sealant as an inorganic adhesive, so that a sealed space is formed in the groove 4.

In the embodiment, the cube unit of the sapphire glass lens 3 has a lens radius of 27 um on a side facing the ultraviolet LED chip 2, the lens radius of the opposite side is 22 um, and the lens thickness of the cube unit is 12 um. The upper and lower surfaces of the sapphire glass lens 3 are both provided with nano-lens arrays to reduce the total reflection loss between the optical window-air interface of the deep ultraviolet LED package, and at the same time increase the coupling ability of the emitted light and enhance the light uniformity of the deep ultraviolet LED.

In addition, in the embodiment, the prepared sapphire glass lens 3 and common sapphire flat glass are respectively used as the cover plates of the ultraviolet LED packaging structure, and other parameters are kept the same, and a ZMAX simulation comparison experiment is performed.

The sapphire glass lens 3 of the double-sided microlens array is installed in one packaging structure, as an experimental case; the sapphire flat glass is installed in the other packaging structure, as a comparative case. The luminous performance of the two structures is measured at a position 10 cm away from the glass surface, and the measured data is shown in FIGS. 4-9:

|  | experimental case | comparative case |
| --- | --- | --- |
| Peak light intensity | 19.187 W/steradian | 11.309 W/steradian |
| Peak illuminance | 0.00153 W/mm$^2$ | 0.001135 W/mm$^2$ |

Therefore, it can be concluded that the light intensity and illuminance in the experimental case are higher than those in the comparative case, and the reason for the better light uniformity of the experimental case is attributed to the refractive index gradient of the microlens array layer and the optical coupling characteristics of the pattern array. For nanostructures, the light transmittance is a function of the geometry and size of the nanostructures and the wavelength of incident light. Therefore, the enhanced optical coupling of the nano-array is a result of the combination of the gradient two-dimensional nanostructure and a surface patterned continuous spherical shape, which can effectively expand a range of the photon escape cone and reduce the total reflection loss at the lens-air interface.

Based on the refraction principle of geometric optics, light at the interface of two transparent media (such as air and glass) will bend toward the area with high refractive index. The higher the refractive index of the material, the stronger the ability of incident light to refract. Through this principle, a complete laser wavefront is spatially divided into many tiny parts, and each part is focused on the focal plane by a corresponding small lens, and the light spots are overlapped to achieve uniform light in a specific area.

Obviously, the above-mentioned embodiment of the present disclosure is merely an example to clearly illustrate the present disclosure, and is not intended to limit the implementation of the present disclosure. For those of ordinary skill in the art, other changes or modifications in different forms can be made on the basis of the above description. It is unnecessary and impossible to list all the implementation ways here. Any modification, equivalent replacement and improvement made within the spirit and principle of the present disclosure shall be included in the protection scope of the claims of the present disclosure.

What is claimed is:

1. A deep ultraviolet light emitting diode (LED) inorganic module packaging device, comprising a ceramic base, an ultraviolet LED chip, and a sapphire glass lens, the ceramic base is provided with a groove, and the ultraviolet LED chip is welded in the groove by a gold-tin eutectic flip-chip manner, and there are at least two metal layers between positive and negative electrodes of the ultraviolet LED chip and a bottom surface of the groove;

an edge of the groove is provided with a stepped structure, and the sapphire glass lens is installed on the stepped structure and completely covers the groove;

wherein an enclosed space formed by the groove and the sapphire glass lens is filled with a protective gas.

2. The deep ultraviolet LED inorganic module packaging device of claim 1, wherein a cube unit of the sapphire glass lens has a lens curvature radius of 27 nm on a side facing the ultraviolet LED chip, and a lens curvature radius of 22 nm on an opposite side from the side facing the ultraviolet LED chip.

3. The deep ultraviolet LED inorganic module packaging device of claim 2, wherein a dominant wavelength of light of the ultraviolet LED chip is 260 nm.

4. The deep ultraviolet LED inorganic module packaging device of claim 3, wherein a lens thickness of the cube unit is 12 nm.

5. The deep ultraviolet LED inorganic module packaging device of claim 4, wherein a dimension of the ultraviolet LED chip is 1 mm×1 mm, and a bottom of the ultraviolet LED chip is provided with symmetrical electrodes.

6. The deep ultraviolet LED inorganic module packaging device of claim 5, wherein the ceramic base is an aluminum nitride ceramic base.

* * * * *